(12) United States Patent
Du et al.

(10) Patent No.: US 10,488,476 B2
(45) Date of Patent: Nov. 26, 2019

(54) RADIO-FREQUENCY CHOKE RESONATOR ASSEMBLY, COIL CABLE AND MAGNETIC RESONANCE IMAGING APPARATUS

(71) Applicant: Siemens Healthcare GmbH, Erlangen (DE)

(72) Inventors: Shu Du, Shenzhen (CN); Jun You, Shenzhen (CN); Wen Ming Li, Shenzhen (CN); JianMin Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/994,356

(22) Filed: May 31, 2018

(65) Prior Publication Data

US 2018/0348316 A1 Dec. 6, 2018

(30) Foreign Application Priority Data

May 31, 2017 (CN) .................... 2017 2 0624427 U (51) Int. Cl.
*G01R 33/36* (2006.01)
*G01R 33/421* (2006.01)
*H01P 7/00* (2006.01)
*H01F 27/28* (2006.01)
*H01F 27/02* (2006.01)
*G01R 33/422* (2006.01)

(52) U.S. Cl.
CPC ..... *G01R 33/3685* (2013.01); *G01R 33/4215* (2013.01); *H01F 27/02* (2013.01); *H01F 27/2885* (2013.01); *H01P 7/005* (2013.01); *G01R 33/422* (2013.01)

(58) Field of Classification Search
CPC ........................ G01R 33/3685; G01R 33/4215
See application file for complete search history.

(56) References Cited

U.S. PATENT DOCUMENTS

| | | | |
|---|---|---|---|
| 4,607,226 A * | 8/1986 | Zeiger .............. | G01R 33/34053 324/300 |
| 4,682,125 A * | 7/1987 | Harrison ............ | G01R 33/3628 324/318 |
| 5,581,186 A * | 12/1996 | Keller .............. | G01R 33/34046 324/318 |

(Continued)

*Primary Examiner* — Reena Aurora
(74) *Attorney, Agent, or Firm* — Schiff Hardin LLP (57) ABSTRACT

An RF choke resonator assembly has a cylindrical magnetic field shielding case with openings at two ends thereof, a magnetic field shielding plate and a winding skeleton, and a capacitive plate inside the case. The magnetic field shielding plate closes the opening at one end of the case, and has a through-hole allowing a cable to pass there through. The cable is wound on the winding skeleton. The capacitive plate is disposed opposite the magnetic field shielding plate in the case, separated therefrom by the winding skeleton, and is electrically connected to the case in a closed manner. The capacitive plate has a through-hole allowing the cable to pass there through. The capacitive plate is remote from the other opening case end opposite the opening closed by the magnetic field shielding plate. An insulation space is formed at that other opening, having a length in the axial direction greater than or equal to one quarter of the length of the magnetic field shielding case in the axial direction.

8 Claims, 6 Drawing Sheets

(56) References Cited

U.S. PATENT DOCUMENTS

| | | | | |
|---|---|---|---|---|
| 5,642,048 A | * | 6/1997 | Crozier | G01R 33/34046 |
| | | | | 324/318 |
| 2006/0290448 A1 | * | 12/2006 | Wynn | H01F 21/10 |
| | | | | 333/176 |
| 2007/0279061 A1 | * | 12/2007 | Erickson | G01R 33/345 |
| | | | | 324/322 |
| 2010/0148775 A1 | * | 6/2010 | Greim | A61B 5/0555 |
| | | | | 324/309 |
| 2014/0327442 A1 | * | 11/2014 | Lin | G01R 33/365 |
| | | | | 324/322 |

* cited by examiner

RADIO-FREQUENCY CHOKE RESONATOR ASSEMBLY, COIL CABLE AND MAGNETIC RESONANCE IMAGING APPARATUS

BACKGROUND OF THE INVENTION

Field of the Invention

The present invention concerns a resonator assembly, in particular to a radio-frequency choke resonator assembly. The present utility model also provides a coil cable and a magnetic resonance imaging apparatus having such a resonator assembly.

Description of the Prior Art

In a magnetic resonance imaging (MRI) system, various coil interfaces on a magnetic resonance diagnostic bed are each connected by a cable to a remote-end radio-frequency (RF) reception and control module. The cable not only receives magnetic resonance signals from the coils, but also transmits remote-end control signals and a power supply to the coils. In general, the cable combines a coaxial line for transmitting RF signals and a DC line for transmitting control signals, with a layer of shielding mesh added outside for the purpose of blocking interference from an emission field.

During emission of an RF pulse by the MRI system, the shielding mesh outer layer of the cable might couple with an RF current, and the coupled RF current will radiate an electromagnetic field. This will not only affect emission field properties and imaging quality; more importantly, the radiated electromagnetic field will be absorbed by the patient and thereby cause tissue burns. In order to suppress the RF current, RF choke resonators (also called an RF trap) are generally constructed on the cable at intervals of a given distance. The RF choke resonator is equivalent to a parallel-connected inductance/capacitance, and the parallel-connected inductance/capacitance in a resonant state is equivalent to an open-circuit resistance, thereby suppressing current on the cable shielding layer.

Multiple coil interfaces are generally provided on the bed of the magnetic resonance scanner on which a subject lies while diagnostic magnetic resonance raw data are being obtained, with each coil interface being connected to the remote-end RF reception and control module by one cable. Due to space restrictions, a situation where multiple cables are laid out in parallel on the bed board will generally arise, and the spacing between some cables is small, so the spacing between the RF choke resonators of different cables will also be very small. Existing RF choke resonators will experience mutual inductance and mutual coupling when close to each other, so that the operating efficiency and choke effect of the RF choke resonators are affected.

SUMMARY OF THE INVENTION

An object of the present invention is to provide an RF choke resonator assembly, which forms an RF choke resonator with a good shielding effect.

Another object of the present invention is to provide a coil cable having such an RF choke resonator assembly.

Another object of the present invention is to provide an MRI apparatus having such a coil cable.

The present invention provides an RF (radio-frequency) choke resonator assembly that allows a cable to pass through to form an RF choke resonator. The RF choke resonator assembly has a magnetic field shielding case, a magnetic field shielding plate, a winding skeleton and a capacitive plate. The magnetic field shielding case is a cylinder with openings at two ends. The magnetic field shielding plate can be disposed in a closed manner at an opening at one end of the magnetic field shielding case, the magnetic field shielding plate being provided with a first through-hole allowing the cable to pass through. The winding skeleton is disposed in the magnetic field shielding case in an axial direction of the magnetic field shielding case, such that the cable can be wound on the winding skeleton. The capacitive plate is disposed opposite the magnetic field shielding plate in the magnetic field shielding case and separated from the magnetic field shielding plate by the winding skeleton, and is electrically connected to the magnetic field shielding case in a closed manner; a second through-hole allowing the cable to pass through is formed in the capacitive plate, and the capacitive plate is remote from an opening at another end opposite the opening at said one end in the axial direction of the magnetic field shielding case, in order to form an insulation space at the opening at the other end, with the length of the insulation space in the axial direction being greater than or equal to one quarter of the length of the magnetic field shielding case in the axial direction. The RF choke resonator formed by the RF choke resonator assembly has a good shielding effect, and can avoid magnetic field interference.

In an embodiment of the RF choke resonator assembly, the RF choke resonator assembly further has an insulating element for blocking the opening at the other end of the magnetic field shielding case with an opening therein for the cable to pass through the insulating element, and the capacitive plate and the insulating element form the insulation space. The insulating element ensures that the cable will not come into contact with the magnetic field shielding case in the insulation space, so as to prevent operation of the RF choke resonator from being affected as a result of contact.

In another embodiment of the RF choke resonator assembly, the RF choke resonator assembly further has a diamagnetic element, which penetrates the winding skeleton in the axial direction from a side on which the capacitive plate is located. The diamagnetic element is used to adjust the inductance of the assembly.

In another embodiment of the RF choke resonator assembly, the diamagnetic element is connected to the winding skeleton by a screw-thread.

In another embodiment of the RF choke resonator assembly, the magnetic field shielding plate and the capacitive plate are connected by welding to the magnetic field shielding case. This can enhance the shielding effect.

In another embodiment of the RF choke resonator assembly, the winding skeleton is provided with a helical groove for winding the cable. The helical groove can make the winding of the cable more convenient.

The present invention also provides a coil cable, having multiple RF choke resonator assemblies as described above, and a cable that passes through each of the RF choke resonator assemblies. In each of the RF choke resonator assemblies, the cable passes through the first through-hole of the magnetic field shielding plate from an opening at one end of the magnetic field shielding case, is wound on the winding skeleton in a direction of extension of the magnetic field shielding case, passes through the second through-hole of the capacitive plate, passes through the insulation space and then projects from an opening at another end of the magnetic field shielding case.

The present invention also provides an MRI apparatus having multiple coil cables as described above.

In an embodiment of the MRI apparatus, a number of the coil cables are disposed parallel to each other, such that multiple RF choke resonator assemblies located on different cables are disposed parallel to each other, and at a side on which an opening at another end of the RF choke resonator assemblies is located, a conductive wire or a capacitance is used to connect two of these cables that are adjacent to each other, so as to realize decoupling between adjacent RF choke resonators.

DESCRIPTION OF THE PREFERRED EMBODIMENTS

The technical features, objectives and effects of the present invention are explained with reference to the accompanying drawings, in which identical reference characters indicate structurally identical components or components with similar structures but identical functions.

As used herein, "schematic" means "serving as an instance, example or illustration". No drawing or embodiment described herein as "schematic" should be interpreted as a more preferred or more advantageous technical solution.

To make the drawings uncluttered, only those parts relevant to the present invention are shown schematically in the drawings; they do not represent the precise structure thereof as a product. Furthermore, to make the drawings uncluttered for ease of understanding, in the case of components having the same structure or function in certain drawings, only one of these is drawn schematically, or only one is marked.

As used herein, "first" and "second" etc. are merely used to differentiate between parts, not to indicate their order or degree of importance, etc.

Figure 1:
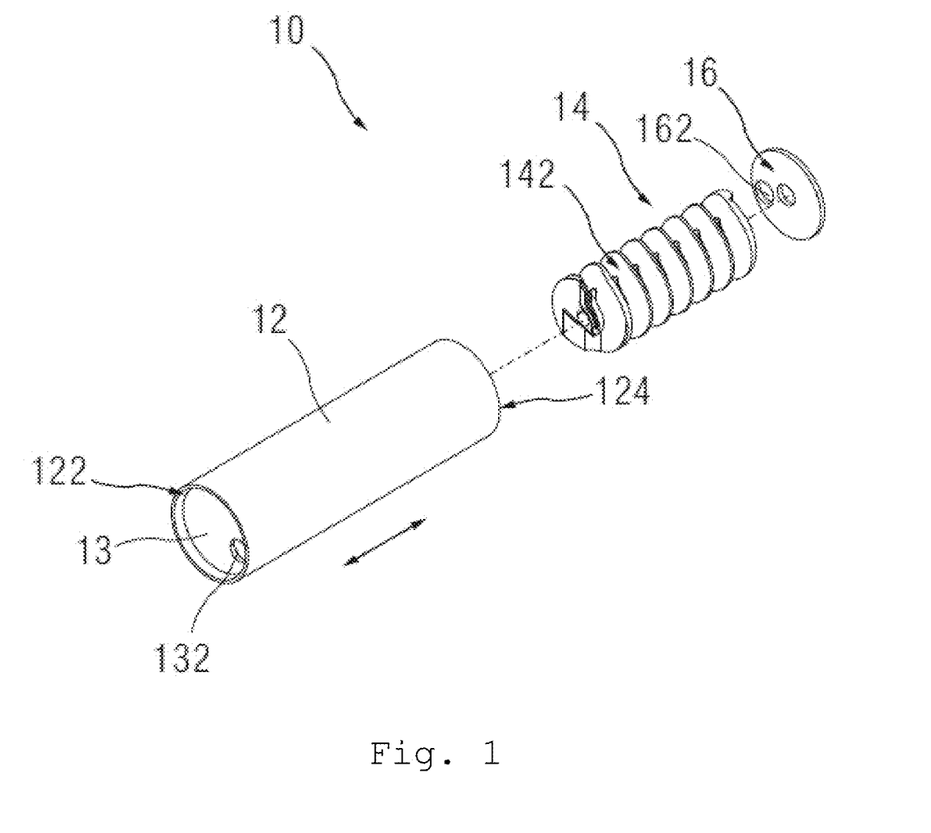
FIG. 1 is an exploded view of an RF choke resonator assembly according to the invention.
Figure 2:
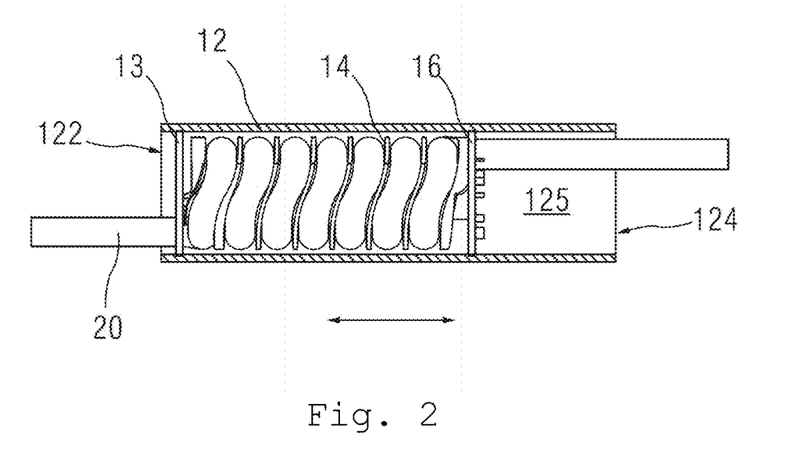
FIG. 2 is a sectional view of the RF choke resonator assembly shown in FIG. 1 after a cable has been passed through to form an RF choke resonator.

FIG. 1 is an exploded schematic view for explaining an embodiment of an RF choke resonator assembly. FIG. 2 is a sectional structural schematic view for explaining the RF choke resonator assembly shown in FIG. 1 after a cable has been passed through to form an RF choke resonator. As shown in FIGS. 1 and 2, the RF choke resonator assembly 10 has a magnetic field shielding case 12, a magnetic field shielding plate 13, a winding skeleton 14 and a capacitive plate 16.

The magnetic field shielding case 12 and the magnetic field shielding plate 13 may be prepared using copper material, but of course are not limited to this. The magnetic field shielding case 12 shown in FIG. 1 is a cylindrical structure, which occupies little space and can be arranged easily, but of course is not limited to this; the magnetic field shielding case 12 need only be a cylinder with openings at two ends, e.g. the two ends of the magnetic field shielding case 12 in FIG. 1 are a closed end 122 and an open end 124 shown in the figure respectively. The magnetic field shielding plate 13 can close an opening disposed at the closed end 122 of the magnetic field shielding case 12, e.g. may be welded to the closed end 122, but of course is not limited to this; for example, since the same material as the magnetic field shielding case 12 may be used, the magnetic field shielding plate 13 could also be formed integrally with the magnetic field shielding case 12. The magnetic field shielding plate 13 is also provided with a first through-hole 132 which only allows a cable 20 to pass through.

The winding skeleton 14 is disposed in the magnetic field shielding case 12 in an axial direction (shown by the arrow in the figures) of the magnetic field shielding case, and the cable 20 can be wound on the winding skeleton 14, as shown in FIG. 2, to form an inductance in the magnetic field shielding case 12. In the embodiment shown in FIG. 1, the winding skeleton 14 is provided with a helical groove 142 for winding the cable; this can make the winding of the cable more convenient. Of course, depending on design requirements, the winding skeleton 14 could also be designed to have another structure or shape, such as a cylindrical shape.

The capacitive plate 16 is disposed opposite the magnetic field shielding plate 13 in the magnetic field shielding case 12, separated from the magnetic field shielding plate by the winding skeleton 14, and is connected to the magnetic field shielding case 12 in a closed and electrically sealed manner, e.g. an edge of the capacitive plate 16 may be welded to the magnetic field shielding case 12, but of course this is not a limitation. A second through-hole 162 allowing the cable 20 to pass through is formed in the capacitive plate 16, and the capacitive plate 16 is remote from an opening of the open end 124 which is opposite the opening of the closed end 122 in the axial direction of the magnetic field shielding case 12, in order to form an insulation space 125 at the opening of the open end 124. Specifically, an insulation space 125 is left between the capacitive plate 16 and the opening of the open end 124 of the magnetic field shielding case 12, with the length of the insulation space in the axial direction being greater than or equal to one quarter of the length of the magnetic field shielding case in the axial direction.

The cable 20 of a coil of a magnetic resonance apparatus is passed into the magnetic field shielding case 12 through the first through-hole 132 of the magnetic field shielding plate 13, then as shown in FIG. 2 is wound helically on the winding skeleton 14, then passed through the second through-hole 162 of the capacitive plate 16, realizing a contact connection with the magnetic field shielding case 12 by means of the capacitive plate 16, and finally projects from the opening of the opening end 124 of the magnetic field shielding case 12 via the insulation space 125. After passing through the first through-hole 132 and the second through-hole 162, the cable 20 may be welded to the magnetic field shielding plate 13 and the capacitive plate 16 respectively.

Thus, the cable wound on the winding skeleton 14 forms an inductance, and once contact connection is established between the cable 20 and the magnetic field shielding case 12 by means of the magnetic field shielding plate 13 and the capacitive plate 16, then the cable 20, magnetic field shielding plate 13, capacitive plate 16 and magnetic field shielding case 12 form a parallel-connected inductance/capacitance, forming an RF choke resonator. Since the opening of the closed end 122 of the magnetic field shielding case 12 is closed by the magnetic field shielding plate 13, the closed end 122 can suppress outward dispersion of magnetic induction lines formed by the inductance. At the side on which the opening of the open end 124 of the magnetic field shielding case 12 is located, an insulation space 125 is left between the capacitive plate 16 and the opening of the open end 124, and the magnetic field shielding case 12 at the insulation space 125 will suppress dispersion of magnetic induction lines. Likewise, the magnetic field shielding plate 13 and the magnetic field shielding case 12 at the insulation space 125 also simultaneously block magnetic induction lines outside the magnetic field shielding case 12 from entering the magnetic field shielding case 12. Thus the RF choke resonator formed by the RF choke resonator assembly has a good shielding effect, and can avoid magnetic field interference.

Figure 3:
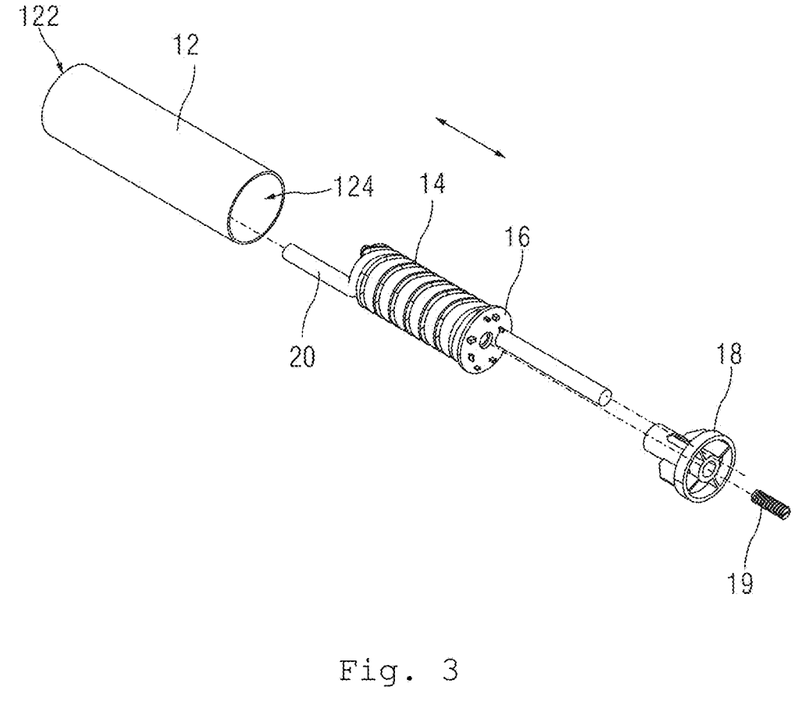
FIG. 3 is an exploded view of another embodiment of the RF choke resonator assembly according to the invention.

FIG. 3 is an exploded structural schematic view for explaining another schematic embodiment of an RF choke resonator assembly. As shown in FIG. 3, the RF choke resonator assembly 10 further has an insulating element 18 for blocking the opening of the open end 124 of the magnetic field shielding case; an opening for the cable 20 to pass through is formed in the insulating element 18, and the capacitive plate 16 and insulating element 18 are used to form the insulation space 125. The insulating element 18 may be of plastic material, and since the cable 20 must pass through the insulating element 18 and project from the opening of the open end 124, the insulating element 18 can ensure that the cable 20 will not come into contact with the magnetic field shielding case 12 in the insulation space 125, so as to prevent operation of the RF choke resonator from being affected as a result of contact. Of course, depending on design requirements, the cable 20 could also be insulated from the magnetic field shielding case 12 in the insulation space 125 in other ways, such as by wrapping with insulating tape.

In the embodiment shown in FIG. 3, the RF choke resonator assembly 10 also has a diamagnetic element 19, which penetrates the winding skeleton 14 in the axial direction shown by the arrow in the figure, from the side on which the capacitive plate 16 is located, so as to be located in the inductance formed by the wound cable 20; the diamagnetic element 19 may be used to adjust inductance. In the embodiment shown in the figure, the diamagnetic element 19 penetrates the winding skeleton 14 by a screw-thread connection.

Figure 4:
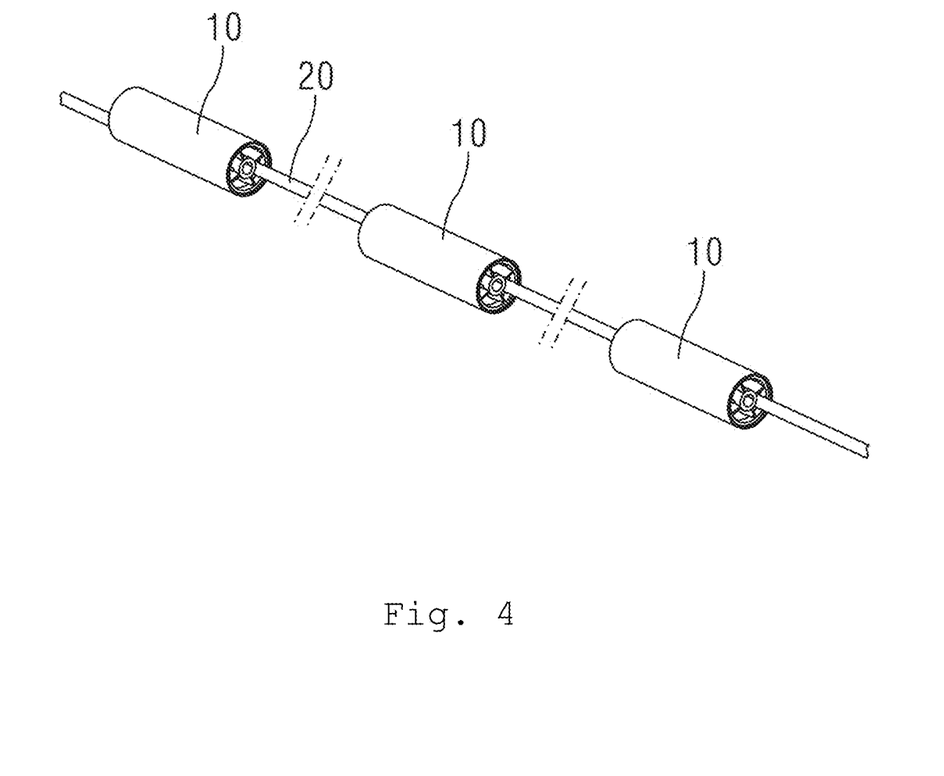
FIG. 4 schematically illustrates an embodiment of a coil cable according to the invention.

The present invention also provides a coil cable for connecting a cable of an MRI apparatus. As shown in FIG. 4, it comprises multiple RF choke resonator assemblies 10 as described above, and one cable 20. The cable 20 can pass through each RF choke resonator assembly 10, and in each RF choke resonator assembly 10, the cable 20 passes through the first through-hole 132 of the magnetic field shielding plate 13 from the opening of the closed end 122 of the magnetic field shielding case 12, is wound on the winding skeleton 14 in the direction of extension of the magnetic field shielding case 12, passes through the second through-hole 162 of the capacitive plate 16, passes through the insulation space 125 and then projects from the opening at the other end of the magnetic field shielding case 12, i.e. the opening of the open end 124. RF choke resonators may be formed on the coil cable at intervals of a given distance, in order to suppress RF current, improve safety and improve the imaging quality of an MRI system.

The present invention also provides an MRI apparatus having a scanner with multiple RF transmitting and/or receiving coils (antennas) respectively connected to multiple coil cables as described above. In one embodiment, in the case where multiple coil cables need to be disposed parallel to each other, multiple RF choke resonator assemblies 10 located on different cables also will be disposed parallel to each other. If two RF choke resonator assemblies 10 are very close, a decoupling protection measure may additionally be adopted in order to prevent coupling between adjacent RF choke resonators.

Figure 5:
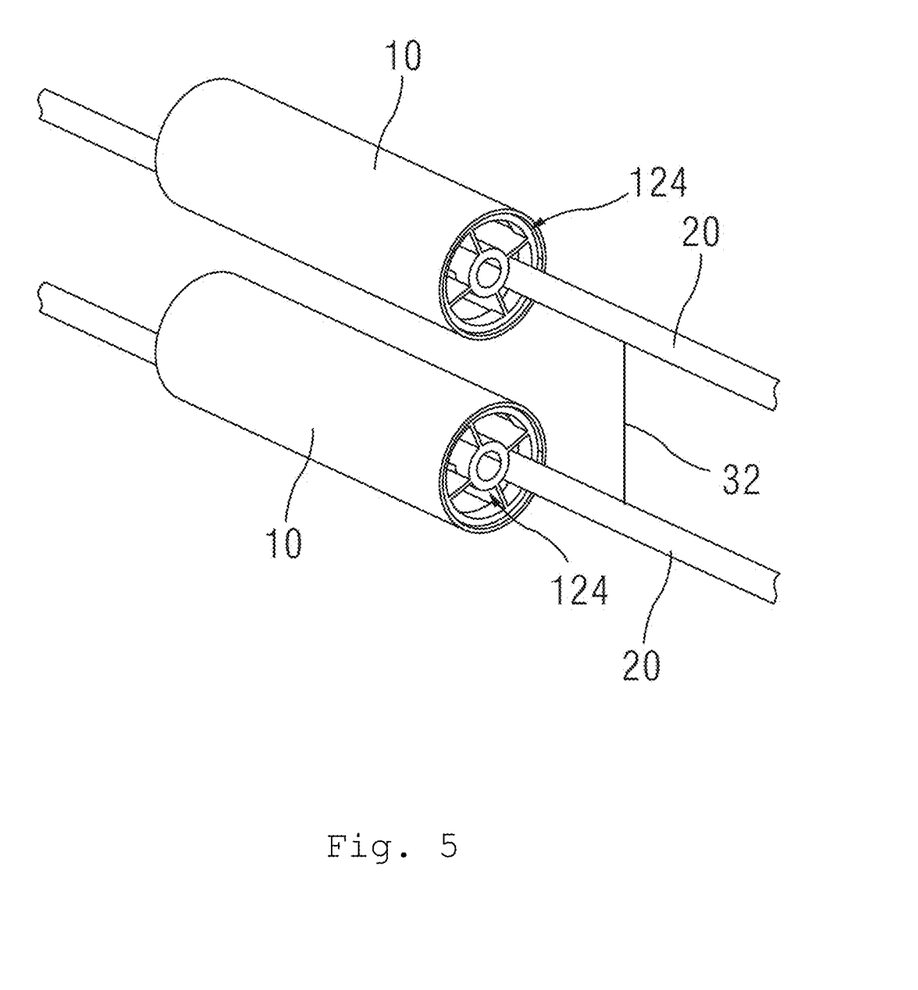
FIG. 5 schematically illustrates a method of connecting RF choke resonator assemblies disposed in parallel in an MRI apparatus according to the invention.
Figure 6:
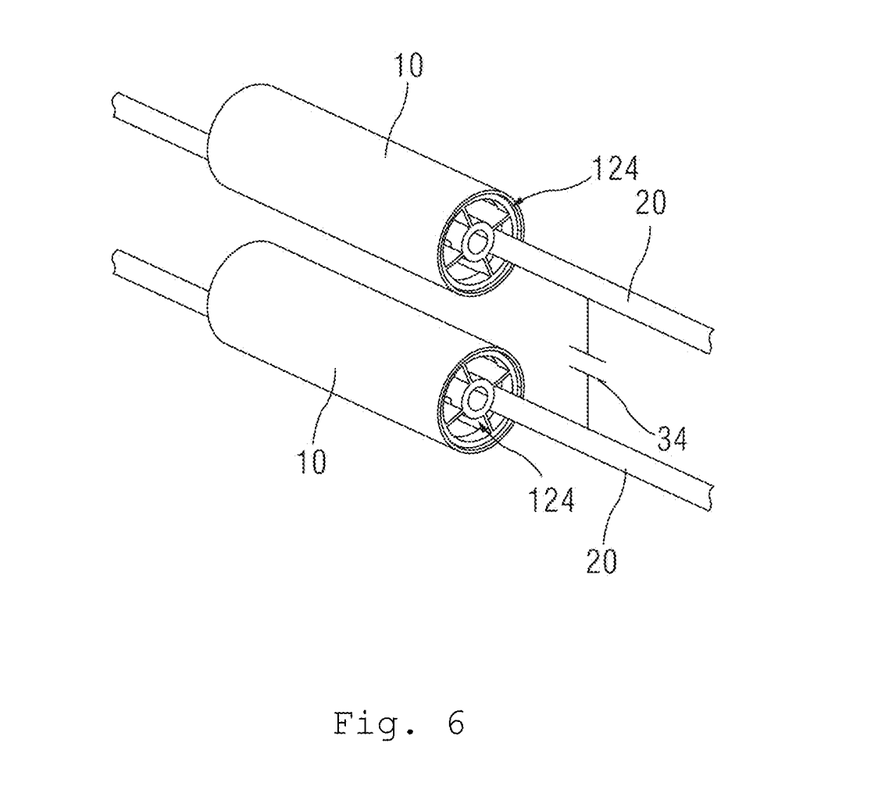
FIG. 6 schematically illustrates another method of connecting RF choke resonator assemblies disposed in parallel in an MRI apparatus according to the invention.

As shown in FIG. 5, when two RF choke resonator assemblies 10 located on two different cables 20 are disposed parallel to each other, a conductive wire 32 may be used to connect the two adjacent cables 20, at the side on which the openings of the open ends 124 of the two RF choke resonator assemblies 10 are located, in order to force the electric potentials of the two RF choke resonators to the same level, in order to realize decoupling. It is also possible, as shown in FIG. 6, to use a capacitance 34 to connect the two adjacent cables 20, at the side on which the openings of the open ends 124 of the two RF choke resonator assemblies 10 are located, to realize decoupling.

It should be understood that although the description herein is based on various embodiments, it is by no means the case that each embodiment contains just one independent technical solution. Such a method of presentation is adopted herein purely for the sake of clarity. Those skilled in the art should consider the description in its entirety. The technical solutions in the various embodiments could also be suitably combined to form other embodiments capable of being understood by those skilled in the art.

The series of detailed explanations set out above are merely particular explanations of feasible embodiments of the present utility model, which are not intended to limit the scope of protection thereof. All equivalent embodiments or changes made without departing from the artistic spirit of the present utility model, such as feature combinations, separations or repetitions, are considered to be included within the scope of the invention.

What is claimed is:
1. A radio-frequency (RF) choke resonator assembly comprising:
a magnetic field shielding case formed as a cylinder with openings at opposite ends of the magnetic field shielding case;
a magnetic field shielding plate closing the opening at one end of the magnetic field shielding case, said magnetic field shielding plate having a through-hole therein having a size allowing a cable that passes through the magnetic field shielding case to also pass through said magnetic field shielding plate;
a winding skeleton inside said magnetic field shielding case extending along an axial direction of the magnetic field shielding case and being configured to allow said cable to be wound on said winding skeleton;
a capacitive plate disposed opposite the magnetic field shielding plate in said magnetic field shielding case and separated from said magnetic field shielding plate by said winding skeleton, said capacitive plate being electrically connected to the magnetic field shielding case in a closed manner;
said capacitive plate having a through-hole therein having a size allowing said cable to also pass through said capacitive plate; and
said capacitive plate being disposed at a distance from the opening of the magnetic field shielding case at the other of said two ends, opposite to said one of said two ends at which said magnetic field shielding plate is disposed, by a distance in said axial direction so as to form an insulation space at said opening of said other of said two ends, said insulation space having a length in said axial direction that is greater than or equal to one quarter of a length of said magnetic field shielding case in the axial direction.

2. An RF choke resonator assembly as claimed in claim 1 comprising an insulating element that blocks said opening at said other end of said magnetic field shielding case, said insulating element having an opening therein allowing said cable to pass through said insulating element, said capacitive plate and said insulating element forming said insulation space.

3. An RF choke resonator assembly as claimed in claim 1 comprising a diamagnetic element penetrating the winding skeleton in said axial direction from a side of said winding skeleton at which said capacitive plate is situated.

4. An RF choke resonator assembly as claimed in claim 3 wherein said diamagnetic element engages said winding skeleton with a screw-threading.

5. An RF choke resonator assembly as claimed in claim 1 wherein said winding skeleton has a helical groove therein adapted to receive said cable for winding on said winding skeleton.

6. A cable arrangement for transmitting electrical signals to or from a radio-frequency (RF) coil of a magnetic resonance apparatus, said cable arrangement comprising:
 a cable;
 a plurality of RF choke resonator assemblies situated spaced from each other along an axial direction of said cable; and
 each of said RF choke resonator assemblies comprising a magnetic field shielding case formed as a cylinder with openings at opposite ends of the magnetic field shielding case, a magnetic field shielding plate closing the opening at one end of the magnetic field shielding case, said magnetic field shielding plate having a through-hole therein having a size allowing said cable to pass through the magnetic field shielding case and to also pass through said magnetic field shielding plate, a winding skeleton inside said magnetic field shielding case extending along an axial direction of the magnetic field shielding case and having said cable wound thereon, a capacitive plate disposed opposite the magnetic field shielding plate in said magnetic field shielding case and separated from said magnetic field shielding plate by said winding skeleton, said capacitive plate being electrically connected to the magnetic field shielding case in a closed manner, said capacitive plate having a through-hole therein having a size allowing said cable to also pass through said capacitive plate, and said capacitive plate being disposed at a distance from the opening of the magnetic field shielding case at the other of said two ends, opposite to said one of said two ends at which said magnetic field shielding plate is disposed, by a distance in said axial direction so as to form an insulation space at said opening of said other of said two ends, said insulation space having a length in said axial direction that is greater than or equal to one quarter of a length of said magnetic field shielding case in the axial direction.

7. A magnetic resonance imaging apparatus comprising:
 a magnetic resonance data acquisition scanner comprising a radio-frequency (RF) coil;
 a cable connected to said RF coil in order to transmit signals to or receive signals from said RF coil;
 a plurality of RF choke resonator assemblies situated spaced from each other along an axial direction of said cable; and
 each of said RF choke resonator assemblies comprising a magnetic field shielding case formed as a cylinder with openings at opposite ends of the magnetic field shielding case, a magnetic field shielding plate closing the opening at one end of the magnetic field shielding case, said magnetic field shielding plate having a through-hole therein having a size allowing said cable to pass through the magnetic field shielding case to also pass through said magnetic field shielding plate, a winding skeleton inside said magnetic field shielding case extending along an axial direction of the magnetic field shielding case and having said cable wound thereon, a capacitive plate disposed opposite the magnetic field shielding plate in said magnetic field shielding case and separated from said magnetic field shielding plate by said winding skeleton, said capacitive plate being electrically connected to the magnetic field shielding case in a closed manner, said capacitive plate having a through-hole therein having a size allowing said cable to also pass through said capacitive plate, and said capacitive plate being disposed at a distance from the opening of the magnetic field shielding case at the other of said two ends, opposite to said one of said two ends at which said magnetic field shielding plate is disposed, by a distance in said axial direction so as to form an insulation space at said opening of said other of said two ends, said insulation space having a length in said axial direction that is greater than or equal to one quarter of a length of said magnetic field shielding case in the axial direction.

8. A magnetic resonance imaging apparatus as claimed in claim 7 wherein said magnetic resonance data acquisition scanner comprises a plurality of RF coils each having a respective cable connected thereto, the respective cables being disposed parallel to each other so that the respective plurality of RF choke assemblies of at least some of said cables are also disposed parallel to each other with at least one RF choke resonator assembly that is disposed parallel to another RF choke resonator assembly on another cable is connected to said other RF choke resonator assembly by a conductive path at one of said two ends thereof, said conductive path being formed by a conductive wire or a capacitance.

* * * * *